(12) United States Patent
Bien et al.

(10) Patent No.: US 12,132,473 B2
(45) Date of Patent: Oct. 29, 2024

(54) SWITCH WITH CASCODE ARRANGEMENT

(71) Applicant: NXP USA, Inc., Austin, TX (US)

(72) Inventors: David Edward Bien, Glendale, AZ (US); Xu Jason Ma, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 36 days.

(21) Appl. No.: 18/183,006

(22) Filed: Mar. 13, 2023

(65) Prior Publication Data

US 2024/0313762 A1 Sep. 19, 2024

(51) Int. Cl.
*H03K 17/082* (2006.01)

(52) U.S. Cl.
CPC ............................ *H03K 17/0822* (2013.01)

(58) Field of Classification Search
CPC .................................................. H03K 17/0822
See application file for complete search history.

(56) References Cited

U.S. PATENT DOCUMENTS

| | | | |
|---|---|---|---|
| 5,406,225 A | 4/1995 | Iida et al. | |
| 5,995,010 A | 11/1999 | Blake et al. | |
| 6,462,527 B1 | 10/2002 | Maneatis | |
| 6,573,752 B1 | 6/2003 | Killat | |
| 7,145,370 B2* | 12/2006 | Bernard | H03K 3/356113 327/112 |
| 7,236,410 B2 | 6/2007 | Schrom et al. | |
| 7,429,873 B2 | 9/2008 | Peschke | |
| 9,979,352 B2 | 5/2018 | Hur et al. | |
| 11,223,358 B2 | 1/2022 | Sanchez et al. | |
| 2007/0159373 A1* | 7/2007 | Peschke | H03K 19/00315 341/156 |
| 2015/0270806 A1 | 9/2015 | Wagh et al. | |
| 2017/0047909 A1* | 2/2017 | Rana | H03K 17/102 |
| 2019/0158027 A1* | 5/2019 | Williams | H03F 3/30 |
| 2021/0175859 A1* | 6/2021 | Brantley | H03F 3/3022 |

(Continued)

FOREIGN PATENT DOCUMENTS

| | | |
|---|---|---|
| CN | 111030608 A | 4/2020 |
| CN | 210693865 U | 6/2020 |

OTHER PUBLICATIONS

Kaya, Kagan: "Meeting Biasing Requirements of Externally Biased RF/Microwave Amplifiers with Active Bias Controllers", Analog Devices AN-1363 Application Note, Rev A, 16 pages (2016-2018).

(Continued)

*Primary Examiner* — Sibin Chen
(74) *Attorney, Agent, or Firm* — Andrew C. Milhollin

(57) ABSTRACT

A switching device may include an input terminal, an output terminal, a primary switching transistor electrically coupled between the input terminal and the output terminal, and a cascode arrangement electrically coupled between the primary switching transistor and the input terminal. The cascode arrangement may include multiple cascode transistors, each having gate terminals coupled to nodes of a voltage divider that is coupled between a positive voltage supply and a reference voltage supply. Emitter-follower bipolar junction transistors (BJTs) may be configured to control voltages at the gate terminals of the primary switching transistor and the cascode transistors to accommodate changes in the output voltage at the output terminal.

19 Claims, 3 Drawing Sheets

(56) References Cited

U.S. PATENT DOCUMENTS

2024/0146305 A1    5/2024   Yu et al.

OTHER PUBLICATIONS

Mandegaran, Sam et al; "A Breakdown Voltage Multiplier for High Voltage Swing Drivers"; IEEE J. of Solid-State Circuits, vol. 42, No. 2; 11 pages (Feb. 2007).

Pashmineh, Sara et al; "A High-Voltage Driver Based on Stacked Low-Voltage Transistors with Minimized On-Resistance for a Buck Converter in 65 nm CMOS"; IEEE Canadian Conference on Electrical and Computer Engineering; 5 pages (2016).

Pashmineh, Sara et al; "Design of high speed high-voltage drivers based on stacked standard CMOS for various supply voltages"; Int'l Midwest Symposium on Circuits and Systems; 4 pages (2013).

Non-Final Office Action; U.S. Appl. No. 18/295,498; 19 pages (Jul. 16, 2024).

\* cited by examiner

SWITCH WITH CASCODE ARRANGEMENT

TECHNICAL FIELD

Embodiments of the subject matter described herein relate generally to switching devices, including switching devices having one or more cascode stages.

BACKGROUND

Semiconductor devices find application in a wide variety of electronic components and systems. For example, semiconductor transistor-based switching devices are commonly used to selectively provide low resistance paths between two nodes. Transistors used to implement such switching devices typically have defined voltage limits. If such voltage limits are exceeded, the corresponding transistor may be damaged, which may negatively impact the operability of the corresponding switching device.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, In an example embodiment, a switch may include a switch input terminal, a switch output terminal, a voltage divider that includes a plurality of series resistances, a first cascode voltage control node, a second cascode voltage control node, and a third cascode voltage control nodes, where the voltage divider is electrically coupled between a positive voltage supply and a reference voltage supply, a primary switching transistor that includes a first current-carrying terminal, a second current-carrying terminal electrically coupled to the first current-carrying terminal and electrically coupled to the switch output terminal, and a first control terminal configured to control the flow of current from the first current-carrying terminal to the second current-carrying terminal, a first cascode transistor that includes a third current-carrying terminal electrically coupled to the switch input terminal, a fourth current-carrying terminal electrically coupled to the third current-carrying terminal, and a second control terminal configured to control the flow of current from the third current-carrying terminal to the fourth current-carrying terminal, where the second control terminal is electrically coupled to the first cascode voltage control node, a second cascode transistor that includes a fifth current-carrying terminal, a sixth current-carrying terminal electrically coupled to the fifth current-carrying terminal, and a third control terminal configured to control the flow of current from the fifth current-carrying terminal to the sixth current-carrying terminal, where the third control terminal is electrically coupled to the second cascode voltage control node, a third cascode transistor that includes a seventh current-carrying terminal, an eighth current-carrying terminal electrically coupled to the seventh current-carrying terminal, and a fourth control terminal configured to control the flow of current from the seventh current-carrying terminal to the eighth current-carrying terminal, where the fourth control terminal is electrically coupled to the third cascode voltage control node, a first bipolar junction transistor (BJT) having a first base terminal electrically coupled to the switch output terminal, a first collector terminal electrically coupled to the reference voltage supply, and a first emitter terminal electrically coupled to the first control terminal of the primary switching transistor, where the first BJT is configured to adjust a first voltage at the first control terminal based on an output voltage at the switch output terminal, and a second BJT having a second base terminal electrically coupled to the switch output terminal, a second collector terminal electrically coupled to the reference voltage supply, and a first emitter terminal electrically coupled to the voltage divider, where the second BJT is configured to adjust respective voltages at each of the first cascode voltage control node, the second cascode voltage control node, and the third cascode voltage control node based on the output voltage at the switch output terminal.

In one or more embodiments, the switch further includes a n-channel metal oxide semiconductor (nMOS) transistor having a ninth current-carrying terminal electrically coupled to the first control terminal of the primary switching transistor, a tenth current-carrying terminal electrically coupled to the ninth current-carrying terminal and to the switch output terminal, and a fifth control terminal configured to control the flow of current from the ninth current-carrying terminal to the tenth current-carrying terminal, and a third BJT having a third base terminal electrically coupled to the switch output terminal, a third collector terminal electrically coupled to the reference voltage supply, and a third emitter terminal electrically coupled to the fifth control terminal of the nMOS transistor.

In one or more embodiments, the switch includes a first resistance electrically coupled between the positive voltage supply and the fifth control terminal of the nMOS transistor, and a second resistance electrically coupled between the fifth control terminal of the nMOS transistor and the third emitter terminal of the third BJT. Respective resistance values of the first resistance and the second resistance may be approximately the same.

In one or more embodiments, the switch includes a diode having an input terminal electrically coupled to the switch output terminal and having an output terminal electrically coupled to the third emitter terminal of the third BJT.

In one or more embodiments, the switch includes a first resistance electrically coupled between the positive voltage supply and the first control terminal of the primary switching transistor, and a second resistance electrically coupled between the first control terminal of the primary switching transistor and the first emitter terminal of the first BJT. Respective resistance values of the first resistance and the second resistance are approximately the same.

In one or more embodiments, the switch includes a n-channel metal oxide semiconductor (nMOS) transistor having a ninth current-carrying terminal electrically coupled to the positive voltage supply, a tenth current-carrying terminal electrically coupled to a node that is electrically coupled to the first resistance and the first control terminal of the primary switching transistor, and a fifth control terminal configured to control the flow of current from the ninth current-carrying terminal to the tenth current-carrying terminal.

In one or more embodiments, the switch includes a first resistance electrically coupled between the fourth control terminal of the third cascode transistor and the eighth current-carrying terminal of the third cascode transistor, and a second resistance electrically coupled between the second control terminal of the first cascode transistor and the fourth current-carrying terminal of the first cascode transistor.

In one or more embodiments, the positive voltage supply is configured to output a second voltage, the reference voltage supply is configured to output a third voltage, and the second voltage is at least 8V higher than the third voltage.

In an example embodiment, a switching device includes an input terminal, an output terminal, a voltage divider electrically coupled between a positive voltage supply configured to provide a first voltage and a first reference voltage supply configured to provide a second voltage, a primary switching transistor having a first source terminal electrically coupled to the output terminal, a first drain terminal, and a first gate terminal, a cascode arrangement electrically coupled between the first drain terminal of the primary switching transistor and the input terminal, where the cascode arrangement is configured to prevent a drain-source voltage of the primary switching transistor from exceeding a drain-source voltage limit of the primary switching transistor when the switching device is closed, a first transistor having a first control terminal electrically coupled to the output terminal, a first current-carrying terminal electrically coupled to the first reference voltage supply, and a second current-carrying terminal electrically coupled to the first gate terminal of the primary switching transistor, and a second transistor having a second control terminal electrically coupled to the output terminal, a third current-carrying terminal electrically coupled to the first reference voltage supply, and a second current-carrying terminal electrically coupled to the voltage divider.

In one or more embodiments, the cascode arrangement includes a first cascode transistor that includes a second drain terminal electrically coupled to the input terminal, a second source terminal, and a second gate terminal electrically coupled to a first node of the voltage divider, a second cascode transistor that includes a third drain terminal electrically coupled to the second source terminal of the first cascode transistor, a third source terminal, and a third gate terminal electrically coupled to a second node of the voltage divider, and a third cascode transistor that includes a fourth drain terminal electrically coupled to the third source terminal of the second cascode transistor, a fourth source terminal electrically coupled to the first drain terminal of the primary switching transistor, and a fourth gate terminal electrically coupled to a third node of the voltage divider.

In one or more embodiments, the switching device includes a n-channel metal oxide semiconductor (nMOS) transistor having a fifth drain terminal electrically coupled to the first gate terminal of the primary switching transistor, a fifth source terminal electrically coupled to the output terminal, and a fifth gate terminal, and a third transistor having a third control terminal electrically coupled to the output terminal, a fifth current-carrying terminal electrically coupled to the first reference voltage supply, and a sixth current-carrying terminal electrically coupled to the fifth gate terminal of the nMOS transistor.

In one or more embodiments, the switching device includes a first resistance electrically coupled between the positive voltage supply and the fifth gate terminal of the nMOS transistor, and a second resistance electrically coupled between the fifth gate terminal of the nMOS transistor and the sixth current-carrying terminal of the third transistor. Respective resistance values of the first resistance and the second resistance may be approximately the same.

In one or more embodiments, the switching device may include a fourth transistor having a fourth control terminal electrically coupled to a second reference voltage supply configured to provide a third voltage that is higher than the second voltage provided by the first reference voltage supply, a seventh current-carrying terminal electrically coupled to the fifth gate terminal of the nMOS transistor and to the sixth current-carrying terminal of the third transistor via the second resistance, and an eighth current-carrying terminal electrically coupled to the positive voltage supply via the first resistance.

In one or more embodiments, the switching device may include a diode having an input electrically coupled to the first reference voltage supply and an output electrically coupled to the sixth current-carrying terminal of the third transistor.

In one or more embodiments, the switching device may include a first resistance electrically coupled between the positive voltage supply and the first gate terminal of the primary switching transistor, and a second resistance electrically coupled between the first gate terminal of the primary switching transistor and the second current-carrying terminal of the first transistor. Respective resistance values of the first resistance and the second resistance may be approximately the same.

In one or more embodiments, the switching device may include a fourth transistor having a fourth control terminal electrically coupled to a second reference voltage supply configured to provide a third voltage that is higher than the second voltage provided by the first reference voltage supply, a seventh current-carrying terminal electrically coupled to the first gate terminal of the primary switching transistor and to the second current-carrying terminal of the first transistor via the second resistance, and an eighth current-carrying terminal electrically coupled to the positive voltage supply via the first resistance.

In one or more embodiments, the switching device may include a n-channel metal oxide semiconductor (nMOS) transistor having a fifth drain terminal electrically coupled to the positive voltage supply, a fifth source terminal electrically coupled to the eighth current-carrying terminal of the fourth transistor and to the first resistance, and a fifth gate terminal electrically coupled to a fourth node of the voltage divider.

In one or more embodiments, the switching device may include a first resistance electrically coupled between the fourth gate terminal of the third cascode transistor and the fourth source terminal of the third cascode transistor, and a second resistance electrically coupled between the second gate terminal of the first cascode transistor and the second source of the first cascode transistor.

In one or more embodiments, the first voltage provided by the positive voltage supply is at least 8V higher than the second voltage output by the first reference voltage supply.

In an example embodiment, control circuitry may include an amplifier transistor configured to receive an RF input signal for amplification, a reference transistor, where the amplifier transistor and the reference transistor are formed on the same semiconductor die, a unity gain buffer having a non-inverting input electrically coupled to the reference transistor, an output electrically coupled to a control terminal of the amplifier transistor, and an inverting input electrically coupled to the output of the unity gain buffer, and a switch that includes an input terminal electrically coupled to the output of the unity gain buffer, an output terminal electrically coupled to the control terminal of the amplifier transistor, a voltage divider coupled between a positive voltage supply configured to provide a first voltage and a reference voltage supply configured to provide a second voltage, a primary switching transistor having a first source terminal electrically coupled to the output terminal, a first drain terminal, and a first gate terminal, a cascode arrangement electrically coupled between the first drain terminal of the primary switching transistor and the input terminal, where the cascode arrangement is configured to prevent a drain-source voltage of the primary switching transistor from exceeding a drain-source voltage limit of the primary switching transistor when the switch is closed, a first bipolar junction transistor (BJT) having a first base terminal electrically coupled to the output terminal, a first collector terminal electrically coupled to the reference voltage supply, and a first emitter terminal electrically coupled to the first gate terminal of the primary switching transistor, and a second BJT having a second base terminal electrically coupled to the output terminal, a second collector terminal electrically coupled to the reference voltage supply, and a second emitter terminal electrically coupled to the voltage divider.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein:

DETAILED DESCRIPTION

Figure 1:
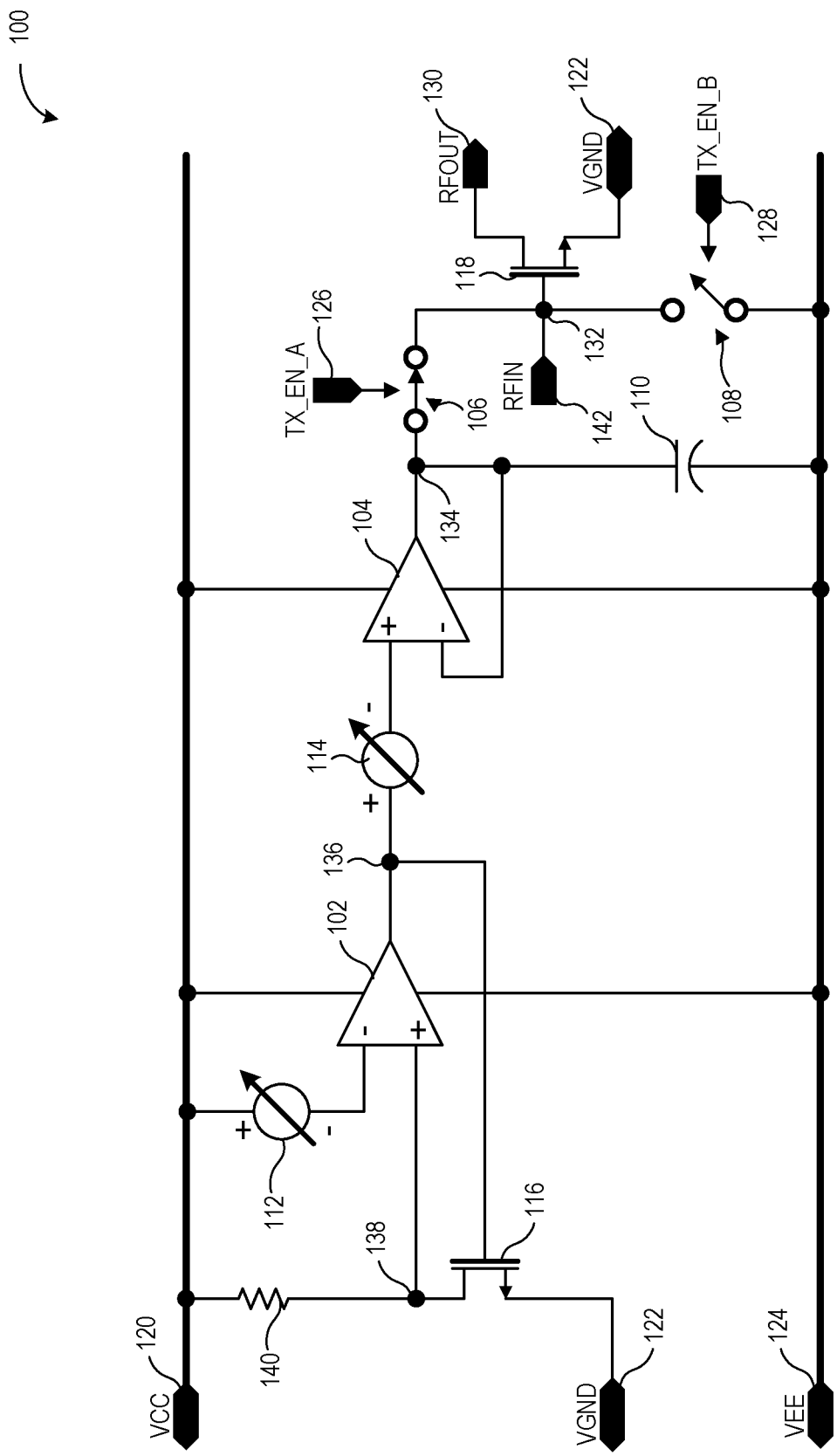
FIG. 1 is a block diagram of example transistor gate control circuitry, in accordance with various embodiments.

The following detailed description is merely illustrative in nature and is not intended to limit the embodiments of the subject matter or the application and uses of such embodiments. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose. As used herein, the words "exemplary" and "example" mean "serving as an example, instance, or illustration." Any implementation described herein as exemplary or an example is not necessarily to be construed as preferred or advantageous over other implementations.

Directional references such as "top," "bottom," "left," "right," "above," "below," and so forth, unless otherwise stated, are not intended to require any preferred orientation and are made with reference to the orientation of the corresponding figure or figures for purposes of illustration.

For the sake of brevity, conventional semiconductor fabrication techniques may not be described in detail herein. In addition, certain terms may also be used herein for reference only, and thus are not intended to be limiting. For instance, the terms "first", "second", and other such numerical terms referring to structures do not imply a sequence or order unless clearly indicated by the context.

Various embodiments described herein relate to a semiconductor transistor-based switching device (i.e., "switch") that includes a cascode arrangement configured to prevent or mitigate conditions in which one or more voltage limits of one or more transistors of the switch are exceeded. For a given switch, if the voltage difference between any two of an input terminal of the switch, an output terminal of the switch, and a control terminal of the switch exceeds the voltage limits of one or more transistors of the switch, such transistors could be damaged. To address this problem, in one or more embodiments, a switch includes a cascode arrangement in which series-connected transistors (i.e., transistors that are coupled together source-to-drain along a single path) are coupled between the input terminal of the switch and the output terminal of the switch, and in which resistances are coupled between gates of adjacent transistors of the series-connected transistors and between the gate and source of one or more of the series-connected transistors. The respective resistance values of the resistances of the cascode arrangement may be selected (e.g., based on expected voltage differences between terminals of the switch) such that the voltage across any given transistor of the switch may be reduced to be within corresponding voltage limits of that transistor, including gate-to-source voltage (Vgs), drain-to-source voltage (Vds), and the gate-to-drain voltage (Vgd) voltage limits. Thus, by including such a cascode arrangement in a switch, the likelihood of transistors of the switch being damaged due to over-voltage may be advantageously reduced.

The cascode arrangement may include one or more cascode stages coupled between a switch input terminal of the switch and a primary switching transistor. Each cascode stage may include a transistor having a gate terminal coupled to a corresponding node of a voltage divider, which may be implemented as multiple resistances coupled together in series. The voltage divider may be coupled between a first positive voltage supply (configured to supply a positive voltage VDD, which may be around 1.8V in one or more embodiments) and a reference supply (configured to supply a negative reference voltage denoted as either VEE or VGND, which may be around-8V in one or more embodiments). Each node of the voltage divider may output a respectively different voltage depending on the combined resistance between that node and the first positive voltage supply.

In one or more embodiments, the cascode arrangement may include multiple cascode stages, where the voltage drop across any two terminals of a given transistor of any given cascode stage of the cascode arrangement does not exceed corresponding voltage limits (i.e., Vgs, Vds, or Vgd limits) of that transistor. While three cascode stages are shown in the following examples, it should be understood that more or fewer cascode stages may be included in the cascode arrangement to accommodate higher or lower possible voltage differentials between the switch input terminal and the switch output terminal.

In one or more embodiments, first, second, and third PNP bipolar junction transistors (BJTs) may be configured as emitter-follower (i.e., common collector) stages and may each have base terminals that are coupled to the switch output terminal. For example, the first emitter-follower BJT may be include an emitter terminal that is coupled to the gate terminal of the primary switching transistor of the switch, such that the voltage that biases the gate terminal of the primary switching transistor is dynamically adjusted as the output voltage of the switch changes. For example, the third emitter-follower BJT may include an emitter terminal that is coupled to the voltage divider of the cascode arrangement, such that cascode bias voltages supplied to the transistors of each cascode stage of the cascode arrangement may be dynamically adjusted as the output voltage of the switch changes. That is, the first and third emitter-follower BJTs may cause gate bias voltages respectively supplied to gates of the primary switching transistor and the transistors of the cascode stages to each be dependent on the output voltage of the switch. For example, the third emitter-follower BJT may include an emitter terminal that is coupled to the gate terminal of an n-channel metal oxide semiconductor (nMOS) transistor having a source terminal coupled to the switch output terminal and a drain terminal coupled to the gate of the primary switching transistor, where the NMOS transistor may turn on when the switch is off to deactivate the first emitter-follower BJT (thereby turning off the primary switching transistor). The second emitter-follower BJT may be configured to dynamically adjust the bias voltage applied to the gate of the nMOS transistor as the output voltage of the switch changes. Thus, the first, second, and third emitter-follower transistors may prevent Vgs and Vgd limits of the primary switching transistor, the transistors of the cascode stages, and the nMOS transistor from being exceeded due to changes in the output voltage of the switch.

In one or more embodiments, a diode may be coupled between the base and emitter of the second emitter-follower BJT. The diode may reduce the likelihood of the second emitter-follower BJT becoming reverse biased due to transient slewing of the voltage at the switch output terminal.

In one or more embodiments, a first resistance may be coupled between first cascode stage control node and a node that is interposed between the source terminal of a first cascode transistor of a first cascode stage and the drain terminal of the primary switching transistor. The first resistance may discharge the gate-source voltage (Vgs) of the first cascode transistor when the first cascode stage control node switches to a lower voltage, which in turn may advantageously reduce the drain-source voltage (Vds) of the primary switching transistor (i.e., below its Vds voltage limit) in such conditions.

In one or more embodiments, a second resistance may be coupled between a third cascode stage control node and a node that is coupled between the drain terminal of a second cascode transistor of a second cascode stage and the source terminal of a third cascode transistor of a third cascode stage, where the drain terminal of the third cascode transistor is coupled to the switch input terminal of the switch. The second resistance may prevent the Vgs voltage limit (e.g., around 3V) of the third cascode transistor from being exceeded when the switch is turned on (closed) and the switch input voltage and output voltage are relatively low (e.g., around 2V above VGND or lower).

In one or more embodiments, an nMOS transistor may be included in the switch, where a gate terminal of the nMOS transistor is coupled to a positive voltage supply configured to supply around 1.8V via a first resistance, a drain terminal of the nMOS transistor is coupled directly to the positive voltage supply, and a source terminal of the device is coupled to a node that is coupled to the positive voltage supply via a second resistance and a p-channel metal oxide semiconductor (pMOS) transistor and that is coupled to the gate of the primary switching device via a BJT. The nMOS transistor may clamp the emitter voltage of the BJT when the collector of the BJT slews negative to prevent the emitter voltage of the BJT from dropping below 0V, where such a drop in emitter voltage would potentially cause the Vds voltage limit of the pMOS transistor to be exceeded.

FIG. 1 is a block diagram of control circuitry 100 that is configured to selectively provide a direct current (DC) bias to a gate terminal of an amplifier transistor 118. As shown, the control circuitry 100 may include a sense amplifier 102, a buffer 104, a first switch 106, a second switch 108, a capacitor 110, a first digital-to-analog convertor (DAC) 112, a second DAC 114, and a sense resistor 140. The control circuitry 100 may be configured to control a reference transistor 116 and the amplifier transistor 118. For example, the control circuitry 100 may be configured as bias circuitry that selectively provides a direct current (DC) bias voltage to the gate of the amplifier transistor 118 based, at least in part, on a voltage detected by the sense amplifier 102 at a drain terminal of the reference transistor 116. As will be described, various elements of the control circuitry 100 may be coupled to one or more of a positive voltage supply 120 configured to supply a positive voltage VCC, a negative voltage supply 124 configured to supply a negative voltage VEE, one or more ground nodes 122 configured to provide reference potential VGND, a first control signal source 126 configured to supply a variable control signal TX_EN_A, or a second control signal source 128 configured to supply a variable control signal TX_EN_B. It should be understood that "ground nodes" herein may not necessarily correspond to "earth ground" but may instead correspond to "signal ground" or another suitable reference potential, in accordance with various embodiments. Herein, the "gate terminal" or "base terminal" of a transistor may sometimes be referred to as a "control terminal", and the "drain terminal" and "source terminal" or "emitter terminal" and "collector terminal" of a transistor may sometimes be referred to as "current-carrying terminals."

The sense amplifier 102 may be an operational amplifier having a positive supply terminal coupled directly to the positive voltage supply 120, a negative supply terminal coupled directly to the negative voltage supply 124, an inverting input coupled to an output of the first DAC 112, a non-inverting input coupled to a node 138 disposed between the sense resistor 140 and the drain of the reference transistor 116, and an output coupled to a node 136 that is coupled to an input of the second DAC 114 and the gate of the reference transistor 116. In or more embodiments, the voltage VCC supplied by the positive voltage supply 120 may be around 5V. In one or more embodiments, the voltage VEE supplied by the negative voltage supply 124 may be around −8V.

The buffer 104 may be an operational amplifier that is configured as a unity gain buffer. That is, the buffer 104 may be configured such that the voltage at the non-inverting input of the buffer 104 may be equal to the voltage at the output of the buffer 104. The buffer 104 may include a positive supply terminal coupled directly to the positive voltage supply 120, a negative supply terminal coupled directly to the negative voltage supply 124, a non-inverting input coupled to the output of the second DAC 114, an output coupled to a node 134, and an inverting input coupled to the output of the buffer 104 via the node 134.

The first DAC 112 may include an input terminal coupled to the positive voltage supply 120, an output terminal coupled to the inverting input of the sense amplifier 102, and a control input at which first digital control signals are received, which determine the voltage output by the first DAC 112 relative to the voltage VCC received from the positive voltage supply 120. For example, the voltage output by the first DAC 112 may be between equal to the positive supply voltage VCC minus around 0.2V and around 1V (depending on the values of the first digital control signals). Herein, an example amount that is said to be "around" or "approximately" a given value is considered to be within +/−10% of the given value unless otherwise indicated.

The second DAC 114 may include an input terminal coupled to each of the output of the sense amplifier 102 and the gate of the reference transistor 116 via the node 136, an output terminal coupled to a non-inverting input of the buffer 104, and a control input at which second digital control signals are received, which determine the voltage output by the second DAC 114 relative to the voltage at the node 136 (i.e., the voltage at the output of the sense amplifier 102). For example, given a voltage of around −3V to around −1.5V output by the sense amplifier 102, the voltage output by the second DAC 114 may be in a range of around −6.5V to around −1V or in a range of around −8V to around 0V (depending, at least in part, on the values of the second digital control signals).

The capacitor 110 may be coupled between the node 134 and the negative voltage supply 124. According to various embodiments, the capacitor 110 may have a capacitance in a range of around 1 nF to around 1 µF. For example, the capacitor 110 may improve the transient response at the node 134. The sense resistor 140 may be coupled between the node 138 and the positive voltage supply 120.

The reference transistor 116 may include a drain terminal coupled to the node 138, a source terminal coupled to the ground node 122, and a gate terminal coupled to the node 136. The amplifier transistor 118 may include a drain terminal coupled to an output 130, a source terminal coupled to the ground node 122, and a gate terminal coupled to the node 132. The first switch 106 may include an input terminal coupled to the node 134, an output terminal coupled to the node 132, and a control terminal coupled to the first control signal source 126 and configured to receive the variable control signal TX_EN_A. The second switch 108 may include an input terminal coupled to the node 132, an output terminal coupled to the negative voltage supply 124, and a control terminal coupled to the second control signal source 128 and configured to receive the variable control signal TX_EN_B.

An RF input signal RFIN may be supplied by an RF signal source 142 to the gate of the amplifier transistor 118 via the node 132. The RF input signal RFIN may be amplified by the amplifier transistor 118 to produce an RF output signal RFOUT at the output 130.

The sense amplifier 102 may be configured to compare a first voltage output by the first DAC 112 (e.g., in a range of around 4V to around 5.2V) to a second voltage at the node 138 (e.g., in a range of around 8V to around 10V), corresponding to the voltage at the drain terminal of the reference transistor 116, then output a third voltage (e.g., in a range of around 2.8V to around 5V), based on this comparison, at the node 136. For example, the third voltage output by the sense amplifier 102 may be equal to the difference between the first voltage and the second voltage received by the sense amplifier 102. The second DAC 114 may apply a voltage offset to the third voltage output by the sense amplifier 102 to produce a fourth voltage at its output (e.g., in a range of around −6.5V to around −1V or in a range of around −8V to around 0V), which the DAC 114 may provide to the non-inverting input of the buffer 104. The buffer 104 may be a unity gain buffer that is configured to output the voltage received at its non-inverting input. That is, the buffer 104 may receive the fourth voltage at its non-inverting input and then output the fourth voltage (e.g., at the node 134).

The output of the buffer 104 may be selectively coupled to the gate of the amplifier transistor 118 via the first switch 106 and a node 132 disposed between the output of the first switch 106 and the gate of the amplifier transistor 118. The first switch 106 may be selectively opened and closed based on the variable control signal TX_EN_A provided to the control terminal of the first switch 106 by the first control signal source 126. The second switch 108 may be selectively opened and closed based on the variable control signal TX_EN_B provided to the control terminal of the second switch 108 by the second control signal source 128. Herein, a switch or transistor is considered to be "closed", "on", or "activated" when a relatively low impedance path is provided between the input terminal of the switch and the output terminal of the switch, permitting electric current to flow between its input terminal and its output terminal. Herein, a switch or transistor is considered to be "open", "off" or "deactivated" when a relatively high impedance path is provided between its input terminal and its output terminal, such that the flow of current is reduced or blocked therebetween. For example, herein, a bipolar junction transistor (BJT) is considered to be "on", when operating in its saturation region, and is considered to be "off" when operating in its cutoff region.

In one or more embodiments, the first control signal source 126 and the second control signal source 128 may be configured such that the first control signal source 126 only closes the first switch 106 (e.g., by asserting the variable control signal TX_EN_A) after the second control signal source 128 has opened the second switch 108 (e.g., by deasserting the variable control signal TX_EN_B), and such that the second control signal source 128 only closes the second switch 108 (e.g., by asserting the variable control signal TX_EN_B) after the first control signal source 126 has opened the first switch 106 (e.g., by deasserting the variable control signal TX_EN_A). Such configuration of the first control signal source 126 and the second control signal source 128 may prevent the first switch 106 and the second switch 108 from being closed simultaneously and, thereby, may prevent undesirable shoot-through current through the first switch 106 and the second switch 108. The variable control signals TX_EN_A and TX_EN_B may be around 1.8V when asserted and around 0V when deasserted.

When the first switch 106 is open and the second switch 108 is closed, the gate of the amplifier transistor 118 is coupled to the negative voltage supply 124 and receives the negative voltage VEE (e.g., around −8V), which causes the amplifier transistor 118 to be open (disabled). When the first switch 106 is closed and the second switch 108 is open, the gate of the amplifier 118 is coupled to the voltage at the output of the buffer 104 (e.g., in a range of around −6.5V to around −1V or in a range of around −8V to around 0V), which acts as a DC bias at the gate sufficient to activate the amplifier transistor 118.

In one or more embodiments, the reference transistor 116 and the amplifier transistor 118 may each be formed on the same semiconductor die and in close proximity to one another, such that the reference transistor 116 exhibits process and temperature dependencies that are similar to those of the amplifier transistor 118. As a non-limiting example, the reference transistor 116 and the amplifier transistor 118 may each be Gallium Nitride (GaN) field effect transistors (FETs) formed on the same GaN die or GaN-on-SiC die as non-limiting examples. Process and temperature dependencies exhibited by the reference transistor 116 affect the voltage at the node 138, which causes corresponding changes in the voltage output by the sense amplifier 102, observable at the node 136, which causes corresponding changes in the voltage provided at the gate of the amplifier transistor 118 (i.e., the "bias voltage") when the first switch 106 is closed. In this way, process and temperature dependencies of the amplifier transistor 118 may be accounted for by dynamically adjusting the bias voltage supplied to the gate of the amplifier transistor 118 based on the similar process and temperature dependencies of the reference transistor 116.

In one or more embodiments, the variable control signal TX_EN_A received at the control terminal of the first switch 106 may be between around 1.8V and around 0V, the voltage received at the input terminal of the first switch 106 may be in a range of around −6.5V to around −1V or in a range of around −8V to around 0V, and the voltage coupled to the output terminal of the first switch 106 may be around −8V (e.g., when coupled to the negative voltage supply 124 when the second switch 108 is closed). Thus, the voltage between the input terminal and the output terminal of the first switch 106 can be as high as 8V when the first switch 106 is turned off, in accordance with one or more embodiments. Conventional metal oxide semiconductor (MOS) transistor devices typically have gate-source, gate-drain, and drain-source breakdown voltages that are respectively much lower than these values (e.g., such breakdown voltages may typically be around 2.5V). In one or more embodiments, to prevent or mitigate damage to transistor devices of the first switch 106 due to over-voltage, the first switch 106 may include a cascode arrangement that is configured to limit the voltage drop across any two terminals of such transistor devices to be below corresponding breakdown voltage thresholds (sometimes referred to herein as "voltage limits") of those transistor devices, as described below.

Figure 2:
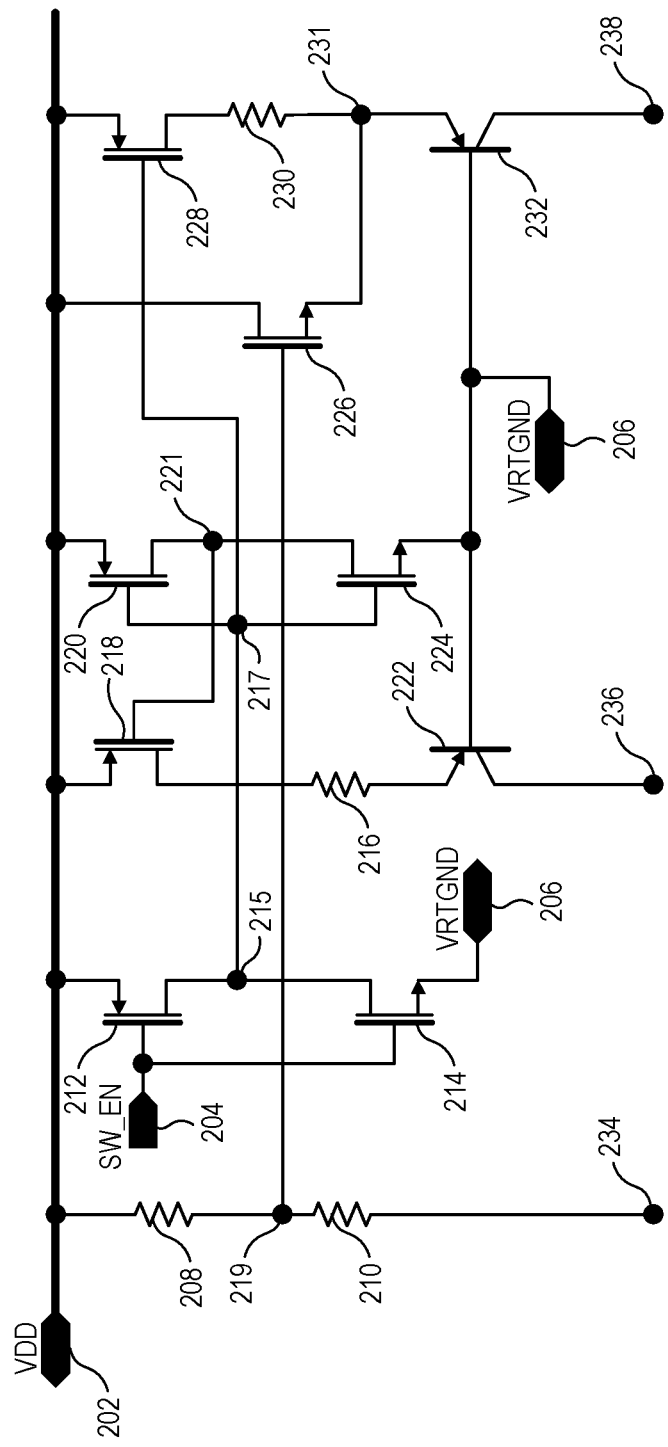
FIGS. 2 and 3 are block diagrams illustrating respective first and second portions of an example switching device, which may be included in the transistor gate control circuitry of FIG. 1, in accordance with various embodiments.
Figure 3:
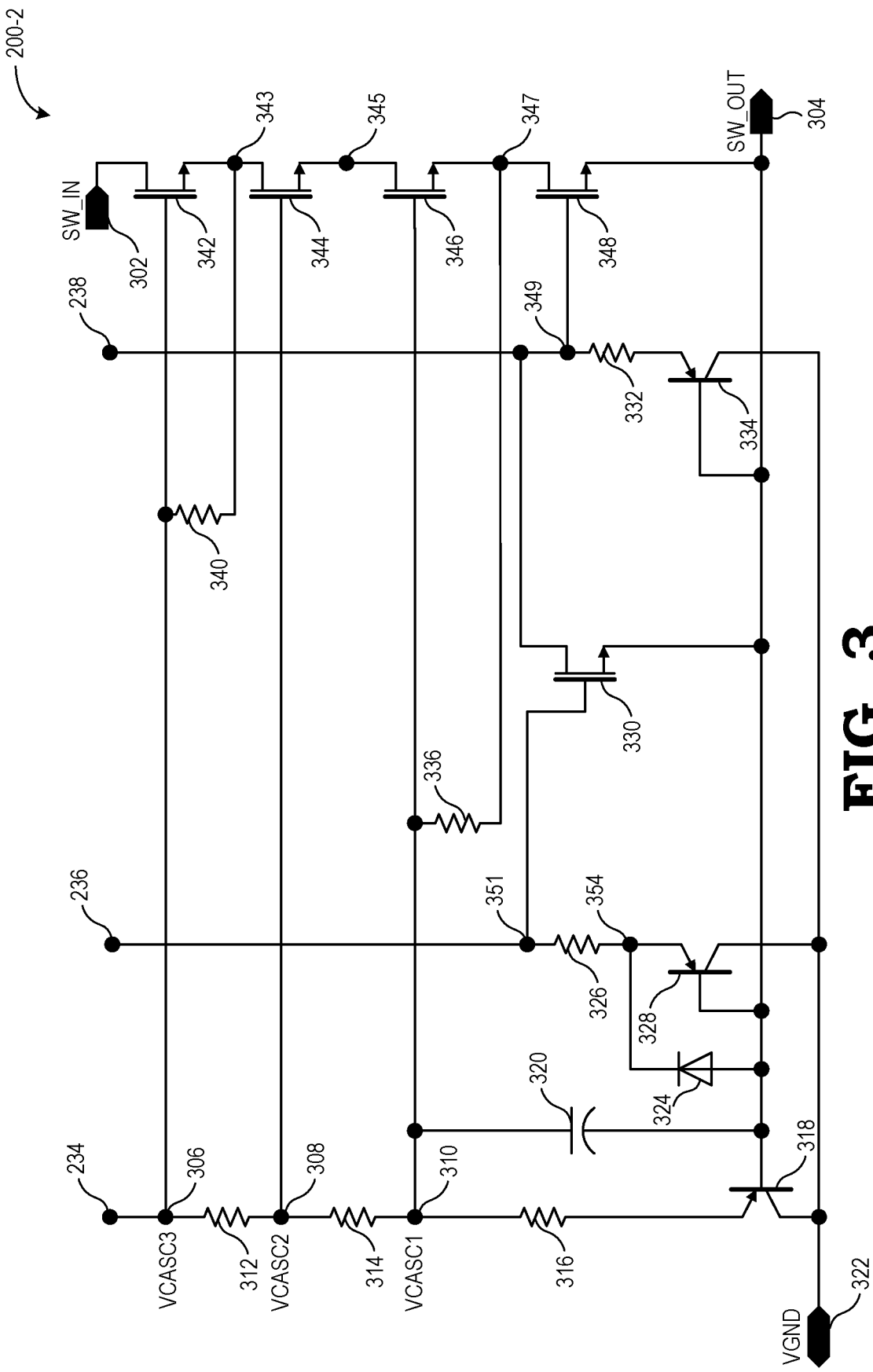

FIGS. 2 and 3 show block diagrams corresponding to respective first and second portions 200-1, 200-2 of a switching device 200 (sometimes referred to herein as the "switch 200") having an extended voltage range due, at least in part, to a cascode arrangement coupled between the input terminal and the output terminal of the switching device 200.

In one or more embodiments, the switching device 200 may be implemented as the first switch 106 of the control circuitry 100 of FIG. 1.

Referring simultaneously to FIG. 2 and FIG. 3, the switching device 200 may include p-channel MOS (pMOS) transistors 212, 218, 220, 228, n-channel MOS (nMOS) transistors 214, 224, 226, 330, 342, 344, 346, 348, bipolar junction transistors (BJTs) 222, 232, 318, 328, 334, resistances 208, 210, 230, 312, 314, 316, 326, 336, 332, 340, a capacitor 320, and a diode 324. Any of the resistances 208, 210, 216, 230, 312, 314, 316, 326, 332, 340 may be implemented via a single resistor or other electrically resistive element or multiple resistors or electrically resistive elements in accordance with various embodiments. In one or more embodiments, each of the BJTs 222, 232, 318, 328, 334 may be PNP BJTs. In one or more embodiments, each of the resistances 216, 230, 326, 332, may have the same or approximately the same resistance value (e.g., around 30 kΩ). The BJTs 222, 232 may be arranged in respective common base configurations. The BJTs 318, 328, 334 may be arranged in respective emitter follower (i.e., common collector) configurations. In one or more embodiments, the transistors 212, 214, 218, 220, 224, 226, 228, 330, 342, 344, 346, 348 may each have Vgs, Vds, and Vgd voltage limits of around 3V, such that inter-terminal voltages above around 3V may stress or damage such transistors.

As will be described, the switching device 200 may be coupled to a positive voltage supply 202 configured to supply a positive voltage VDD, a first reference voltage supply 322 configured to provide a first reference voltage VGND, a second reference voltage supply 206 configured to provide a second reference voltage VRTGND, and a control signal source 204 (e.g., corresponding to the first control signal source 126 of FIG. 1 in one or more embodiments) configured to supply a control signal SW_EN (e.g., corresponding to the variable control signal TX_EN_A in one or more embodiments). In one or more embodiments, the reference voltage VGND and the corresponding first reference voltage supply 322 may correspond to the negative voltage VEE and the corresponding negative voltage supply 124 of FIG. 1.

As shown in FIG. 2, the resistance 208 may include a first terminal coupled to the positive voltage supply 202 and a second terminal coupled to a node 219. The resistance 210 may include a first terminal coupled to the node 219 and a second terminal coupled to a node 234 (i.e., to a node 306 of FIG. 3 via the node 234). The resistance 216 may include a first terminal coupled to the drain terminal of the pMOS transistor 218 and a second terminal coupled to the emitter terminal of the BJT 222. The resistance 230 may include a first terminal coupled to the drain of the pMOS transistor 228 and a second terminal coupled to the node 231. In one or more embodiments, the resistances 208, 210, 216, 230 may have respective resistances values in a range of around 10 kΩ to around 100 kΩ.

The pMOS transistor 212 may include a source terminal coupled to the positive voltage supply 202, a drain terminal coupled to a node 215, and a gate terminal coupled to the control signal source 204 and to the gate terminal of the nMOS transistor 214. Current flow between source and drain terminals of the pMOS transistor 212 may be controlled by the control signal SW_EN. The node 215 may be coupled to the node 217. The pMOS transistor 218 may include a source terminal coupled to the positive voltage supply 202, a drain terminal coupled to a first terminal of the resistance 216, and a gate terminal coupled to a node 221. Current flow between source and drain terminals of the pMOS transistor 218 may be controlled by the voltage at the node 221. The pMOS transistor 220 may include a source terminal coupled to the positive voltage supply 202, a drain terminal coupled to the node 221, and a gate terminal coupled to the node 217. Current flow between source and drain terminals of the pMOS transistor 220 may be controlled by the voltage at the node 215. The pMOS transistor 228 may include a source terminal coupled to the positive voltage supply 202, a drain terminal coupled to a first terminal of the resistance 230, and a gate terminal coupled to the node 215. Current flow between source and drain terminals of the pMOS transistor 228 may be controlled by the voltage at the node 215.

The nMOS transistor 214 may include a drain terminal coupled to the node 215, a source terminal coupled to the second reference voltage supply 206, and a gate terminal coupled to the control signal source 204 and to the gate terminal of the pMOS transistor 212. Current flow between source and drain terminals of the nMOS transistor 214 may be controlled by the control signal SW_EN. The nMOS transistor 224 may include a drain terminal coupled to the node 221, a source terminal coupled to the second reference voltage supply 206, and a gate terminal coupled to the node 217. Current flow between source and drain terminals of the nMOS transistor 224 may be controlled by the voltage at the node 215. The nMOS transistor 226 may include a drain terminal coupled to the positive voltage supply 202, a source terminal coupled to a node 231, and a gate terminal coupled to the node 219. Current flow between source and drain terminals of the nMOS transistor 226 may be controlled by the voltage at the node 219.

The BJT 222 may include an emitter terminal coupled to the second terminal of the resistance 216, a collector terminal coupled to a node 236 (i.e., to a node 351 of FIG. 3 via the node 236), and a base terminal coupled to the second reference voltage supply 206. The BJT 232 may include an emitter terminal coupled to the node 231, a collector terminal coupled to the node 238 (i.e., to a node 349 of FIG. 3 via the node 238), and a base terminal coupled to the second reference voltage supply 206. The BJTs 222, 232 each be in a respective common base configuration.

As shown in FIG. 3, the switching device 200 may include a switch input terminal 302 and a switch output terminal 304. The voltage signal provided at the switch input terminal 302 is denoted as SW_IN in the present example. The voltage signal provided at the switch output terminal 304 is denoted as SW_OUT in the present example.

The resistance 312 include a first terminal coupled to the node 306 and a second terminal coupled to a node 308. A voltage VCASC3 (sometimes referred to herein as the "third cascode bias voltage") at the node 306 may be equal to the positive supply voltage VDD minus the voltage drop across the resistances 208, 210. The resistance 314 may include a first terminal coupled to the node 308 and a second terminal coupled to a node 310. A voltage VCASC2 (sometimes referred to herein as the "second cascode bias voltage") at the node 308 may be equal to the positive supply voltage VDD minus the voltage drop across the resistances 208, 210, 312. The voltage VCASC2 may also be calculated as the voltage VCASC3 minus the voltage drop across the resistance 312. The resistance 316 may include a first terminal coupled to the node 310 and a second terminal coupled to an emitter terminal of the BJT 318. A voltage VCASC1 (sometimes referred to herein as the "first cascode bias voltage") at the node 310 may be equal to the positive supply voltage VDD minus the voltage drop across the resistances 208, 210, 312, 314. The voltage VCASC1 may also be calculated as the voltage VCASC2 minus the voltage drop across the resistance 314. The resistances 312, 314, 316, in combination with the resistances 208 and 210 of FIG. 2, form a voltage divider, with the voltages at each node of the voltage divider (e.g., nodes 219, 306, 308, 310) being dynamically adjusted by the BJT 318 based on the output voltage SW_OUT.

The resistance 326 may include a first terminal coupled to the node 351 (i.e., to the collector terminal of the BJT 222 via the node 351 and the node 236) and a second terminal coupled to the node 354. The resistance 332 may include a first terminal coupled to the node 349 (i.e., to the collector terminal of the BJT 232 via the node 349 and the node 238) and a second terminal coupled to an emitter terminal of the BJT 334. The resistance 336 may include a first terminal coupled to the node 310 and a second terminal coupled to a node 347. The resistance 340 may include a first terminal coupled to the node 306 and a second terminal coupled to a node 343. In one or more embodiments, the resistances 312, 314, 316, 326, 332, 336, 340 may have respective resistance values in a range of around 10 kΩ to around 100 kΩ.

The BJT 318 may include an emitter terminal coupled to the second terminal of the resistance 316, a collector terminal coupled to the first reference voltage supply 322, and a base terminal coupled to a switch output terminal 304. The BJT 328 may include an emitter terminal coupled to the node 354, a collector terminal coupled to the first reference voltage supply 322, and a base terminal coupled to the switch output terminal 304. The BJT 334 may include an emitter terminal coupled to the second terminal of the resistance 332, a collector terminal coupled to the first reference voltage supply 322, and a base terminal coupled to the switch output terminal 304. The BJTs 318, 328, 334 may each be arranged in respective emitter-follower configurations (e.g., each having a base-emitter voltage gain of approximately 1), and are sometimes referred to herein as emitter-follower BJTs 318, 328, 334. Because the BJTs 318, 328, 334 are in emitter-follower configurations, with bases coupled to the switch output terminal 304 to receive the output voltage SW_OUT, the emitter terminal voltages of the BJTs 318, 328, 334, when on, may be equal to or approximately equal to the output voltage SW_OUT plus around 0.7V.

The capacitor 320 may include a first terminal coupled to the node 310 and a second terminal coupled to the switch output terminal 304. In one or more embodiments, the capacitor 320 may have a capacitance value in a range of around 1 pF to around 1 nF. The diode 324 include an input terminal coupled to the switch output terminal 304 and an output terminal coupled to the node 354.

The nMOS transistor 330 may include a drain terminal coupled to the node 238 (i.e., to the collector terminal of the BJT 232 via the node 238), a source terminal coupled to the switch output terminal 304, and a gate terminal coupled to the node 351 (i.e., to the collector terminal of the BJT 222 via the node 351 and the node 236). Current flow between the source and drain terminals of the nMOS transistor 330 may be controlled by the voltage at the node 351.

The cascode arrangement of the present example may include a first cascode stage, as second cascode stage, and a third cascode stage. The third cascode stage may be coupled to the switch input terminal 302 and may receive the voltage SW_IN. The first cascode stage may be coupled to the nMOS transistor 348, sometimes referred to herein as the "primary switching transistor 348." The second cascode stage may be coupled between the first cascode stage and the third cascode stage.

The first cascode stage may include the node 310, sometimes referred to herein as the "first cascode stage control node 310" and the nMOS transistor 346, sometimes referred to herein as the "first cascode transistor 346". The second cascode stage may include the node 308, sometimes referred to herein as the "second cascode stage control node 308" and the nMOS transistor 344, sometimes referred to herein as the "second cascode transistor 344". The third cascode stage may include the node 306, sometimes referred to herein as the "third cascode stage control node 306" and the nMOS transistor 342, sometimes referred to herein as the "third cascode transistor 342". It should be understood that, in one or more other embodiments, more or fewer cascode stages than the three shown in the present example may be included in the cascode arrangement (e.g., to accommodate higher or lower operating voltage ranges of the switch 200).

The third cascode transistor 342 may include a drain terminal coupled to the switch input terminal 302, a source terminal coupled to the drain terminal of the second cascode transistor 344 via the node 343, and a gate terminal coupled to the third cascode stage control node 306. As described above, the node 343 is coupled to the gate of the third cascode transistor 342 and to the third cascode stage control node 306 via the resistance 340. The third cascode stage control node 306 may be coupled between the resistances 210 (via the node 234) and 312 and may provide the third cascode bias voltage VCASC3 to the gate terminal of the third cascode transistor 342.

The second cascode transistor 344 may include a drain terminal coupled to the source terminal of the third cascode transistor 342 via the node 343, a source terminal coupled to the drain terminal of the first cascode transistor 346 via the node 345, and a gate terminal coupled to the second cascode stage control node 308. The second cascode stage control node 308 may be coupled between the resistances 312, 314 and may provide the second cascode bias voltage VCASC2 to the gate terminal of the second cascode transistor 344.

The first cascode transistor 346 may include a drain terminal coupled to the source terminal of the second cascode transistor 344 via the node 345, a source terminal coupled to the drain terminal of the primary switching transistor 348 via the node 347, and a gate terminal coupled to the first cascode stage control node 310. As described above, the node 347 is coupled to the gate of the first cascode transistor 346 and to the first cascode stage control node 310 via the resistance 336. The first cascode stage control node 310 may be coupled between the resistances 314, 316 and may provide the first cascode bias voltage VCASC1 to the gate terminal of the third cascode transistor 342.

The primary switching transistor 348 may include a drain terminal coupled to the source terminal of the first cascode transistor 346 via the node 347, a source terminal coupled to the switch output terminal 304, and a gate terminal coupled to the node 349.

Referring now simultaneously to FIGS. 2 and 3, in one or more embodiments, the positive voltage supply may be configured to provide a positive voltage VDD of around 1.8V. The second reference voltage supply 206 may be configured to provide a reference voltage VRTGND of around 0V. The first reference voltage supply 322 may be configured to provide a reference voltage VGND of around −8V. In one or more embodiments, the reference voltage VGND may correspond to the negative voltage VEE supplied by the negative voltage supply 124 of FIG. 1. The switch input terminal 302 may be configured to receive a variable voltage SW_IN in a range of around −6.5V to around −1V or in a range of around −8V to around 0V. In one or more embodiments, the input voltage SW_IN received at the switch input terminal 302 may correspond to the voltage output by the buffer 104 of FIG. 1. The variable voltage SW_OUT at the switch output terminal 304 may be in a range of around −6.5V to around −1V or in a range of around −8V to around 0V (e.g., equal to or around the input voltage SW_IN) when the switch 200 is closed (on) and a range of around −7V to around −9V (e.g., equal to or around VGND) when the switch 200 is open (off). That is, the output voltage SW_OUT may be between around −9V to around −1V depending on the state of the switch 200 and the value of SW_IN. The control signal source 204 may be configured to supply a control signal SW_EN (e.g., corresponding to the variable control signal TX_EN_A in one or more embodiments) in a range of between around 0V and around 1.8V.

The switch 200 may be turned on in response to assertion of the control signal SW_EN (e.g., setting SW_EN to around 1.8V). When the switch 200 is turned on, each of the primary switching transistor 348 and the first, second, and third cascode transistors 346, 344, 342 are turned on, which may provide a low impedance path between the switch output terminal 304 and the switch input terminal 302, such that the output voltage SW_OUT may be equal or approximately equal to the input voltage SW_IN (e.g., in a range of around −6.5V to around −1V or in a range of around −8V to around 0V).

When the switch 200 is on, the control signal SW_EN turns the pMOS transistor 212 off and the nMOS transistor 214 on, such that the nodes 215, 217 are at or around VRTGND (e.g., at or around 0V). When the node 217 is at or around 0V, the pMOS transistor 220 is on, the pMOS transistor 228 is on, and the nMOS transistor 224 is off, such that the node 221 is at around 1.8V. When the pMOS transistor 228 is on, current flows through the resistor 230, the BJT 232, the node 238, the resistor 332, and the BJT 334, such that these elements couple the node 349 (i.e., the gate of the primary switching transistor 348) to the positive voltage supply 202. This flow of current may cause the voltage at the gate terminal of the primary switching transistor 348 to be around the sum of the base-emitter voltage (VBE) of the BJT 334 and the voltage drop across the transistor 332, where the sum may be sufficiently greater than SW_OUT as to turn on the primary switching transistor 348.

When the node 221 is at around 1.8V, the pMOS transistor 218 is off, such that the emitter terminal of the BJT 222 is not connected to the positive voltage supply 202 and is turned off (e.g., with approximately no current flow through the collector terminal of the BJT 222). This causes the voltage drop across the resistance 326 to be approximately equal to zero, such that the voltage at the node 351 is equal to or approximately equal to the voltage at the node 354, corresponding to the voltage at the emitter of the BJT 328. For example, when the switch 200 is on, the voltage at the emitter of the BJT 328 may be equal to or approximately equal to the sum of the output voltage SW_OUT and the base-emitter voltage of the BJT 328 (e.g., around 0.5V when the switch 200 is on), where the sum may be in a range of around −7.5V to around 0.5V, given that the output voltage SW_OUT is equal or approximately equal to the input voltage SW_IN when the switch 200 is on. That is, the emitter voltage of the BJT 328 may dynamically change as a function of the change in the output voltage SW_OUT when the control signal SW_EN is asserted. Thus, when the switch 200 is turned on, the voltage difference between the node 351 and the output voltage SW_OUT may be at around the base-emitter voltage of the BJT 328 (e.g., around 0.5V or less), which is sufficient to keep the nMOS transistor 330 turned off without exceeding the Vgs limit (e.g., around 3V) of the nMOS transistor 330 Turning the nMOS transistor 330 off prevents the node 349 from being coupled to the switch output terminal 304 through the nMOS transistor 330, which would otherwise cause the primary switching transistor 348 to turn off.

The base of the BJT 334 is coupled to the switch output terminal 304, such that the emitter voltage of the BJT 334 (emitter to collector) may be equal to around the output voltage SW_OUT plus around 0.7V. That is, the BJT 334 may be configured to dynamically adjust the voltage at the node 349 based on the output voltage SW_OUT when the switch 200 is on to turn on the primary switching transistor 348 without exceeding the Vgs limit (e.g., around 3V) of the primary switching transistor 348. For example, the voltage drop across the resistance 332 may be around 1.1V, so the voltage difference between the node 349 and SW_OUT may be around 1.8V when the switch 200 is on, which causes the primary switching transistor 348 to turn on.

The base of the BJT 318 is coupled to the switch output terminal 304, such that the voltage at the emitter of the BJT 318 may be equal to around the output voltage SW_OUT plus around 0.7V. That is, the voltage at the emitter of the BJT 318 may dynamically change as a function of the change in the output voltage SW_OUT. In this way, the BJT 318 may be configured to dynamically adjust the voltage at the node 219 and the voltages VCASC1, VCASC2, VCASC3 at each of the cascode stage control nodes 306, 308, 310 based on the output voltage SW_OUT when the switch 200 is on, sufficient to turn on each of the first cascode transistor 346, the second cascode transistor 344, and the third cascode transistor 342 without exceeding the Vgs or Vgd limits (e.g., each around 3V) of any of the first cascode transistor 346, the second cascode transistor 344, and the third cascode transistor 342.

The switch 200 may be turned off in response to deassertion of the control signal SW_EN (e.g., setting SW_EN to around 0V). When the switch 200 is turned off, each of the primary switching transistor 348 and the first, second, and third cascode transistors 346, 344, 342 are turned off, which may reduce or prevent the flow of current between the switch input terminal 302 and the switch output terminal 304. In one or more embodiments, when the switch 200 is turned off, the switch output terminal 304 is coupled to the first reference voltage supply 322 (e.g., to the negative voltage supply 124 via the second switch 108 of FIG. 1), such that the output voltage SW_OUT may be equal or approximately equal to VGND (e.g., around −8V). In one or more other embodiments, when the switch 200 is turned off, the switch output terminal 304 corresponds to an open circuit, and the output voltage SW_OUT may remain at the same voltage as when the switch 200 was on (e.g., due to node capacitance) or may drift to a different voltage over time.

When the switch 200 is off, the control signal SW_EN turns the pMOS transistor 212 on and the nMOS transistor 214 off, such that the nodes 215, 217 are at or around VDD (e.g., at or around 1.8V). When the node 217 is at or around 1.8V, the pMOS transistor 220 is off, the pMOS transistor 228 is off, and the nMOS transistor 224 is on, such that the node 221 is at around 0V and the BJT 232 is turned off, such that the node 349 is electrically isolated from the positive voltage supply 202.

When the node 221 is at around 0V, the pMOS transistor 218 is on, such that the emitter terminal of the BJT 222 is connected to the positive voltage supply 202. As described above, the base of the BJT 328 is coupled to the switch output terminal 304, such that the voltage drop across the BJT 328 (emitter to collector) may dynamically change as a function of the change in the output voltage SW_OUT. The voltage drop across the resistance 326 may be around 1.1V when the switch 200 is off, such that the voltage at the node 351 may be equal to the voltage at the node 354 (SW_OUT+ 0.7V) plus 1.1V. This causes a Vgs of around 1.8V for the nMOS transistor 330, independent of the value of the output voltage SW_OUT (i.e., within the operational range of the switch). Thus, when the switch 200 is turned off, the voltage at the node 351 may be dynamically set by the BJT 328 based on the output voltage SW_OUT to keep the nMOS transistor 330 turned on with a Vgs of around 1.8V, which does not exceed the Vgs or Vgd limits (e.g., each around 3V) of the nMOS transistor 330. Turning the nMOS transistor 330 on couples the node 349 to the switch output terminal 304 through the nMOS transistor 330, which causes the BJT 334 to be turned off and causes the primary switching transistor 348 to be turned off.

As described above, the base of the BJT 318 is coupled to the switch output terminal 304, such that the voltage at the emitter of the BJT 318 may be equal to the output voltage SW_OUT plus around 0.7V. That is, the BJT 318 may be configured to set the voltage at the node 219 and the voltages VCASC1, VCASC2, VCASC3 at each of the cascode stage control nodes 306, 308, 310 based on the output voltage SW_OUT when the switch 200 is off, sufficient to ensure that Vgs and Vgd limits (e.g., around 3V) of the first cascode transistor 346, the second cascode transistor 344, and the third cascode transistor 342 are not exceeded, even when the value of the output voltage SW_OUT changes.

As an non-limiting example in which the input voltage SW_IN is around −4V, when the switch 200 is on, the control signal SW_EN is at around 1.8V, the output voltage SW_OUT is at around −4V, the first cascode voltage VCASC1 is at around −3.2V, the second cascode voltage VCASC2 is at around −2.6V, and the third cascode voltage VCASC3 is at around −2.1V. Continuing the example, when the switch 200 is off, the control signal SW_EN is at around 0V, the output voltage SW_OUT is at around −8V, the first cascode voltage VCASC1 is at around −6.2V, the second cascode voltage VCASC2 is at around −4.6V, and the third cascode voltage is at around −2.9V.

In some instances, such as when the state of the switch 200 changes from off to on, transient slewing may occur at the switch output terminal 304. The diode 324, which is coupled between the switch output terminal 304 and the emitter terminal of the BJT 328, may advantageously mitigate or prevent reverse biasing of the BJT 328 that may be caused by such transient slewing.

When the switch 200 is off, the resistance 336, which is coupled between the node 347 and the first cascode stage control node 310, may discharge the gate-source voltage of the first cascode transistor 346 in response to a decrease in the voltage VCASC1 (e.g., which may occur when the switch 200 changes states or when the value of the output voltage SW_OUT changes). This arrangement of the resistance 336 may advantageously reduce the drain-source voltage of the primary switching transistor 348 under such conditions, which may prevent the Vds voltage limit of the primary switching transistor 348 from being exceeded.

The resistance 340, which is coupled between the third cascode stage control node 306 and the node 343, may prevent the Vgs voltage limit (e.g., around 3V) of the third cascode transistor 342 from being exceeded when the switch 200 is turned on and each of the switch input voltage SW_IN and the switch output voltage SW_OUT are relatively low (e.g., around −6V or lower).

The NMOS transistor 226, which includes a gate terminal coupled to the node 19, a drain terminal coupled directly to the positive voltage supply 202, and a source terminal coupled to the node 231, may clamp the emitter voltage of the BJT 232 when the collector terminal of the BJT 232 slews negative. This clamping may prevent this emitter voltage of the BJT 232 from dropping below 0V, and may thereby prevent the Vds voltage limit (e.g., around 3V) of the pMOS transistor 228 from being exceeded.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in one or more embodiments of the depicted subject matter. Furthermore, the term "amplifier" used herein should be understood to refer to a "power amplifier" unless noted otherwise.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A switch comprising:
   a switch input terminal;
   a switch output terminal;
   a voltage divider that includes a plurality of series resistances, a first cascode voltage control node, a second cascode voltage control node, and a third cascode voltage control nodes, wherein the voltage divider is electrically coupled between a positive voltage supply and a reference voltage supply;
   a primary switching transistor that includes a first current-carrying terminal, a second current-carrying terminal electrically coupled to the first current-carrying terminal and electrically coupled to the switch output terminal, and a first control terminal configured to control the flow of current from the first current-carrying terminal to the second current-carrying terminal;
   a first cascode transistor that includes a third current-carrying terminal electrically coupled to the switch input terminal, a fourth current-carrying terminal electrically coupled to the third current-carrying terminal, and a second control terminal configured to control the flow of current from the third current-carrying terminal to the fourth current-carrying terminal, wherein the second control terminal is electrically coupled to the first cascode voltage control node;
   a second cascode transistor that includes a fifth current-carrying terminal, a sixth current-carrying terminal electrically coupled to the fifth current-carrying terminal, and a third control terminal configured to control the flow of current from the fifth current-carrying terminal to the sixth current-carrying terminal, wherein the third control terminal is electrically coupled to the second cascode voltage control node;
   a third cascode transistor that includes a seventh current-carrying terminal, an eighth current-carrying terminal electrically coupled to the seventh current-carrying terminal, and a fourth control terminal configured to control the flow of current from the seventh current-carrying terminal to the eighth current-carrying terminal, wherein the fourth control terminal is electrically coupled to the third cascode voltage control node;
   a first bipolar junction transistor (BJT) having a first base terminal electrically coupled to the switch output terminal, a first collector terminal electrically coupled to the reference voltage supply, and a first emitter terminal electrically coupled to the first control terminal of the primary switching transistor, wherein the first BJT is configured to adjust a first voltage at the first control terminal based on an output voltage at the switch output terminal; and
   a second BJT having a second base terminal electrically coupled to the switch output terminal, a second collector terminal electrically coupled to the reference voltage supply, and a first emitter terminal electrically coupled to the voltage divider, wherein the second BJT is configured to adjust respective voltages at each of the first cascode voltage control node, the second cascode voltage control node, and the third cascode voltage control node based on the output voltage at the switch output terminal.

2. The switch of claim 1, further comprising:
   a n-channel metal oxide semiconductor (nMOS) transistor having a ninth current-carrying terminal electrically coupled to the first control terminal of the primary switching transistor, a tenth current-carrying terminal electrically coupled to the ninth current-carrying terminal and to the switch output terminal, and a fifth control terminal configured to control the flow of current from the ninth current-carrying terminal to the tenth current-carrying terminal; and
   a third BJT having a third base terminal electrically coupled to the switch output terminal, a third collector terminal electrically coupled to the reference voltage supply, and a third emitter terminal electrically coupled to the fifth control terminal of the nMOS transistor.

3. The switch of claim 2, further comprising:
   a first resistance electrically coupled between the positive voltage supply and the fifth control terminal of the nMOS transistor; and
   a second resistance electrically coupled between the fifth control terminal of the nMOS transistor and the third emitter terminal of the third BJT, wherein respective resistance values of the first resistance and the second resistance are approximately the same.

4. The switch of claim 3, further comprising:
   a diode having an input terminal electrically coupled to the switch output terminal and having an output terminal electrically coupled to the third emitter terminal of the third BJT.

5. The switch of claim 1, further comprising:
a first resistance electrically coupled between the positive voltage supply and the first control terminal of the primary switching transistor; and
a second resistance electrically coupled between the first control terminal of the primary switching transistor and the first emitter terminal of the first BJT, wherein respective resistance values of the first resistance and the second resistance are approximately the same.

6. The switch of claim 5, further comprising:
a n-channel metal oxide semiconductor (nMOS) transistor having a ninth current-carrying terminal electrically coupled to the positive voltage supply, a tenth current-carrying terminal electrically coupled to a node that is electrically coupled to the first resistance and the first control terminal of the primary switching transistor, and a fifth control terminal configured to control the flow of current from the ninth current-carrying terminal to the tenth current-carrying terminal.

7. The switch of claim 1, further comprising:
a first resistance electrically coupled between the fourth control terminal of the third cascode transistor and the eighth current-carrying terminal of the third cascode transistor; and
a second resistance electrically coupled between the second control terminal of the first cascode transistor and the fourth current-carrying terminal of the first cascode transistor.

8. The switch of claim 1, wherein the positive voltage supply is configured to output a second voltage, the reference voltage supply is configured to output a third voltage, and the second voltage is at least 8V higher than the third voltage.

9. A switching device comprising:
an input terminal;
an output terminal;
a voltage divider electrically coupled between a positive voltage supply configured to provide a first voltage and a first reference voltage supply configured to provide a second voltage;
a primary switching transistor having a first source terminal electrically coupled to the output terminal, a first drain terminal, and a first gate terminal;
a cascode arrangement electrically coupled between the first drain terminal of the primary switching transistor and the input terminal, wherein the cascode arrangement is configured to prevent a drain-source voltage of the primary switching transistor from exceeding a drain-source voltage limit of the primary switching transistor when the switching device is closed;
a first transistor having a first control terminal electrically coupled to the output terminal, a first current-carrying terminal electrically coupled to the first reference voltage supply, and a second current-carrying terminal electrically coupled to the first gate terminal of the primary switching transistor; and
a second transistor having a second control terminal electrically coupled to the output terminal, a third current-carrying terminal electrically coupled to the first reference voltage supply, and a second current-carrying terminal electrically coupled to the voltage divider, wherein the cascode arrangement comprises:
a first cascode transistor that includes a second drain terminal electrically coupled to the input terminal, a second source terminal, and a second gate terminal electrically coupled to a first node of the voltage divider;
a second cascode transistor that includes a third drain terminal electrically coupled to the second source terminal of the first cascode transistor, a third source terminal, and a third gate terminal electrically coupled to a second node of the voltage divider; and
a third cascode transistor that includes a fourth drain terminal electrically coupled to the third source terminal of the second cascode transistor, a fourth source terminal electrically coupled to the first drain terminal of the primary switching transistor, and a fourth gate terminal electrically coupled to a third node of the voltage divider.

10. The switching device of claim 9, further comprising:
a n-channel metal oxide semiconductor (nMOS) transistor having a fifth drain terminal electrically coupled to the first gate terminal of the primary switching transistor, a fifth source terminal electrically coupled to the output terminal, and a fifth gate terminal; and
a third transistor having a third control terminal electrically coupled to the output terminal, a fifth current-carrying terminal electrically coupled to the first reference voltage supply, and a sixth current-carrying terminal electrically coupled to the fifth gate terminal of the nMOS transistor.

11. The switching device of claim 10, further comprising:
a first resistance electrically coupled between the positive voltage supply and the fifth gate terminal of the nMOS transistor; and
a second resistance electrically coupled between the fifth gate terminal of the nMOS transistor and the sixth current-carrying terminal of the third transistor, wherein respective resistance values of the first resistance and the second resistance are approximately the same.

12. The switching device of claim 11, further comprising:
a fourth transistor having a fourth control terminal electrically coupled to a second reference voltage supply configured to provide a third voltage that is higher than the second voltage provided by the first reference voltage supply, a seventh current-carrying terminal electrically coupled to the fifth gate terminal of the nMOS transistor and to the sixth current-carrying terminal of the third transistor via the second resistance, and an eighth current-carrying terminal electrically coupled to the positive voltage supply via the first resistance.

13. The switching device of claim 11, further comprising:
a diode having an input electrically coupled to the first reference voltage supply and an output electrically coupled to the sixth current-carrying terminal of the third transistor.

14. The switching device of claim 9, further comprising:
a first resistance electrically coupled between the positive voltage supply and the first gate terminal of the primary switching transistor; and
a second resistance electrically coupled between the first gate terminal of the primary switching transistor and the second current-carrying terminal of the first transistor, wherein respective resistance values of the first resistance and the second resistance are approximately the same.

15. The switching device of claim 14, further comprising:
a fourth transistor having a fourth control terminal electrically coupled to a second reference voltage supply configured to provide a third voltage that is higher than the second voltage provided by the first reference voltage supply, a seventh current-carrying terminal electrically coupled to the first gate terminal of the primary switching transistor and to the second current-carrying terminal of the first transistor via the second resistance, and an eighth current-carrying terminal electrically coupled to the positive voltage supply via the first resistance.

16. The switching device of claim 15, further comprising:
a n-channel metal oxide semiconductor (nMOS) transistor having a fifth drain terminal electrically coupled to the positive voltage supply, a fifth source terminal electrically coupled to the eighth current-carrying terminal of the fourth transistor and to the first resistance, and a fifth gate terminal electrically coupled to a fourth node of the voltage divider.

17. The switching device of claim 9, further comprising:
a first resistance electrically coupled between the fourth gate terminal of the third cascode transistor and the fourth source terminal of the third cascode transistor; and
a second resistance electrically coupled between the second gate terminal of the first cascode transistor and the second source of the first cascode transistor.

18. The switching device of claim 9, wherein the first voltage provided by the positive voltage supply is at least 8V higher than the second voltage output by the first reference voltage supply.

19. Control circuitry comprising:
an amplifier transistor configured to receive an RF input signal for amplification;
a reference transistor, wherein the amplifier transistor and the reference transistor are formed on the same semiconductor die;
a unity gain buffer having a non-inverting input electrically coupled to the reference transistor, an output electrically coupled to a control terminal of the amplifier transistor, and an inverting input electrically coupled to the output of the unity gain buffer; and
a switch comprising:
an input terminal electrically coupled to the output of the unity gain buffer;
an output terminal electrically coupled to the control terminal of the amplifier transistor;
a voltage divider coupled between a positive voltage supply configured to provide a first voltage and a reference voltage supply configured to provide a second voltage;
a primary switching transistor having a first source terminal electrically coupled to the output terminal, a first drain terminal, and a first gate terminal;
a cascode arrangement electrically coupled between the first drain terminal of the primary switching transistor and the input terminal, wherein the cascode arrangement is configured to prevent a drain-source voltage of the primary switching transistor from exceeding a drain-source voltage limit of the primary switching transistor when the switch is closed;
a first bipolar junction transistor (BJT) having a first base terminal electrically coupled to the output terminal, a first collector terminal electrically coupled to the reference voltage supply, and a first emitter terminal electrically coupled to the first gate terminal of the primary switching transistor; and
a second BJT having a second base terminal electrically coupled to the output terminal, a second collector terminal electrically coupled to the reference voltage supply, and a second emitter terminal electrically coupled to the voltage divider.

* * * * *